United States Patent [19]
Bergano et al.

[11] Patent Number: 5,173,957
[45] Date of Patent: Dec. 22, 1992

[54] PUMP REDUNDANCY FOR OPTICAL AMPLIFIERS

[75] Inventors: Neal S. Bergano, Lincroft; Richard F. Druckenmiller, Freehold; Franklin W. Kerfoot, III, Red Bank; Patrick R. Trischitta, Holmdel, all of N.J.

[73] Assignee: AT&T Bell Laboratories, Murray Hill, N.J.

[21] Appl. No.: 758,665

[22] Filed: Sep. 12, 1991

[51] Int. Cl.⁵ .................... G02B 6/00; G02B 6/36
[52] U.S. Cl. ............................... 385/24; 372/30
[58] Field of Search ............................... 385/27

[56] References Cited

U.S. PATENT DOCUMENTS

| | | | |
|---|---|---|---|
| 4,963,832 | 10/1990 | Desurvire et al. | 385/30 X |
| 5,058,974 | 10/1991 | Mollenauer | 385/24 X |
| 5,088,095 | 2/1992 | Zirngibl | 372/30 X |

*Primary Examiner*—Akm E. Ullah
*Attorney, Agent, or Firm*—E. Weiss

[57] ABSTRACT

Currently laser diode pump redundancy for an optical fiber amplifier is obtained by selectively connecting one of two diode pumps to an optical amplifier via an optical switch. When the diode laser pump which is connected to the amplifier becomes defective, the optical switch is activated, either remotely or automatically, and the good laser diode is substituted for the defective laser diode pump. In another arrangement, two laser diodes are coupled to an optical fiber amplifier via a polarization-dependent optical coupler. In each instance, a second laser diode is required to provide pump redundancy for an optical fiber amplifier.

In this invention, at least, two laser diodes are coupled via a 3 dB optical coupler to supply pump power to each of the two optical fiber amplifiers simultaneously. If one of the laser diode pumps fails, the other laser diode pump provides pump power to each of the optical fiber amplifiers. Thus, with the addition of a 3 dB coupler, pump redundancy for a pair of optical fiber amplifiers is obtained with only two laser diode pumps instead of the normally required four laser diode pumps. In practice, only one of the two pumps can be active, and the other turned on only when the first pump fails. In another embodiment, the two laser diode pumps can be active at all times where each laser diode pump is operated at either full or less than full power. In the arrangement where the laser diode pumps are operated simultaneously at less than full power, when a pump failure occurs the power output of the good laser diode pump can be increased to compensate for the loss of power from the defective pump.

7 Claims, 3 Drawing Sheets

PUMP REDUNDANCY FOR OPTICAL AMPLIFIERS

TECHNICAL FIELD

This invention relates generally to optical fiber amplifiers and more particularly to optical fiber amplifiers having pump redundancy.

BACKGROUND OF THE INVENTION

There is considerable interest in using rare earth doped optical fiber amplifiers to amplify weak optical signals for both local and trunk optical telecommunications networks. The rare earth doped optical amplifying fibers are found to have low cost, exhibit low-noise, display a relatively large bandwidth which is not polarization dependent, present substantially reduced cross talk problems and provide low insertion losses at the relevant operating wavelengths which are used in optical communications. Rare earth doped optical fiber amplifiers can be coupled end-to-end to a transmission fiber, and coupled, through a directional coupler, to a laser diode pump. The directional coupler is designed to have a high coupling ratio at the pump wavelength and a low coupling ratio at the signal wavelength so that maximum pump energy is coupled to the amplifier with minimal signal loss. When the amplifying medium is excited by the pump laser, signal light traversing the amplifier experiences gain. The pump energy can be made to propagate either co-directionally or contra-directionally relative to the signal energy.

In optical fiber systems that use optical amplifiers as repeaters, the laser diode that supplies the pump power to each fiber amplifier is the most expensive and the only active component. As such, these laser pumps can be considered to be the most likely component in the system to age and eventually fail.

In systems where high levels of system availability and reliability are a requirement, such as, for example, in undersea systems, redundant laser pumps for each amplifier are required as a backup in the event that a laser pump fails.

The present invention is directed toward a new, improved and more economical arrangement for providing a redundant laser pump for optical amplifiers.

SUMMARY OF THE INVENTION

Currently laser diode pump redundancy for an optical fiber amplifier is obtained by selectively connecting one of two diode pumps to an optical amplifier via an optical switch. When the diode laser pump which is connected to the amplifier becomes defective, the optical switch is activated, either remotely or automatically, and the good laser diode is substituted for the defective laser diode pump. In another arrangement, two laser diodes are coupled to an optical fiber amplifier via a polarization-dependent optical coupler. In each instance, a second laser diode is required to provide pump redundancy for an optical fiber amplifier.

In this invention, at least, two laser diodes are coupled via a 3 dB optical coupler to supply pump power to each of the two optical fiber amplifiers simultaneously. If one of the laser diode pumps fails, the other laser diode pump provides pump power to each of the optical fiber amplifiers. Thus, with the addition of a 3 dB coupler, pump redundancy for a pair of optical fiber amplifiers is obtained with only two laser diode pumps instead of the normally required four laser diode pumps. In practice, only one of the two pumps can be active, and the other turned on only when the first pump fails. In another embodiment, the two laser diode pumps can be active at all times where each laser diode pump is operated at either full or less than full power. In the arrangement where the laser diode pumps are operated simultaneously at less than full power, when a pump failure occurs the power output of the good laser diode pump can be increased to compensate for the loss of power from the defective pump.

BRIEF DESCRIPTION OF THE DRAWING

In the drawing forming a part of this application and in which like parts are designated by like reference numerals throughout the same.

DETAILED DESCRIPTION

Rare earth doped fiber amplifiers for amplifying weak signals for both local and trunk optical telecommunication networks are of particular interest because of their low insertion loss, broad gain bandwidth and polarization insensitive gain. In use, the doped optical fiber is normally coupled to a pump so that a weak optical input signal at some wavelength within the rare earth gain profile experiences a desired amplification. Pump light which can be coupled into the optical fiber via a directional coupler may propagate either co-directionally or contra-directionally within the fiber relative to the signal. The directional coupler can have a high coupling ratio at the pump wavelength and a low coupling ratio at the signal wavelength.

Erbium-doped optical amplifiers, when used as power amplifiers, repeaters and preamplifiers in lightwave systems have been responsible for significant improvement in the performance of long-distance transmission systems, networks, CATV distribution and the like. Important features of these amplifiers include high gain, low noise and high saturated output power.

New undersea and terrestrial lightwave systems that use erbium-doped fiber amplifiers rather than conventional opto-electronic regenerators to boost the optical signals are being given serious consideration. As noted previously, the laser diode that supplies the pump power to the fiber amplifier is the only active component and, therefore, is the most likely component in the system that will fail. It is also among the most expensive component of the amplifier.

Figure 1:
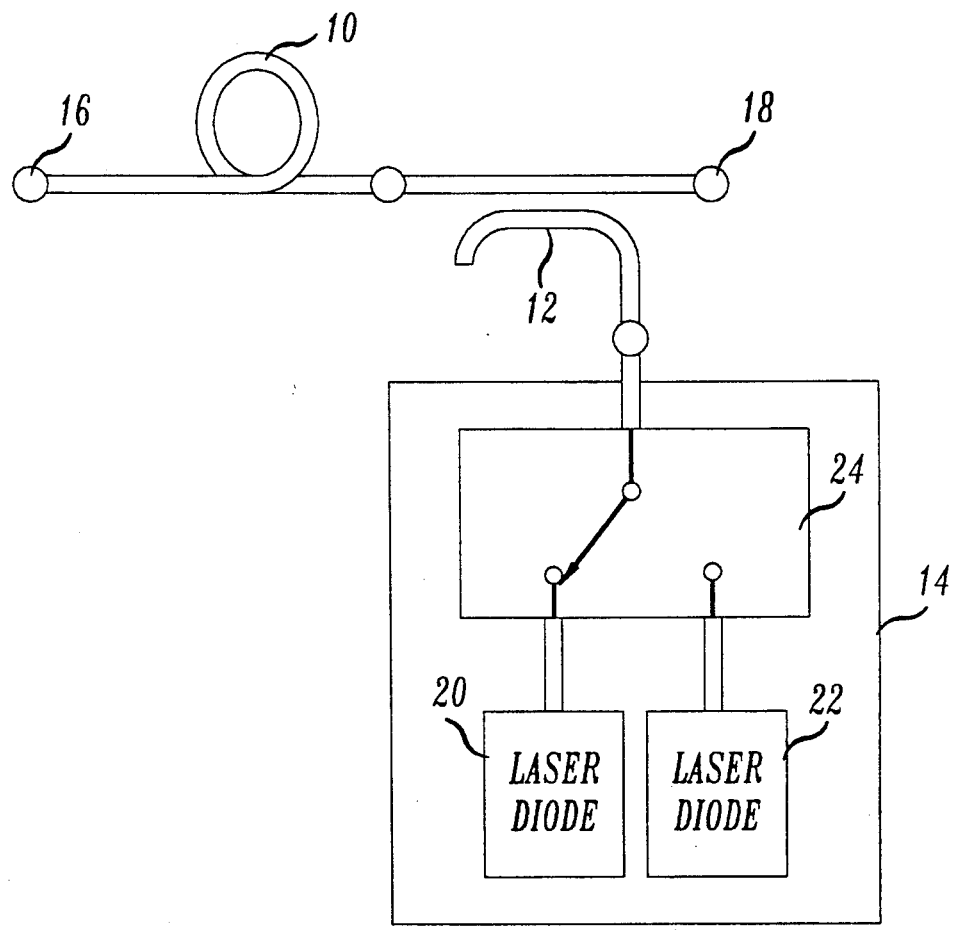
FIG. 1 illustrates a prior art arrangement for providing pump power redundancy to optical fiber amplifiers.

Referring to FIG. 1, there is illustrated a prior art system for providing pump redundancy. As illustrated in FIG. 1, an optical fiber amplifier comprises an optical fiber 10 doped with a rare earth element such as erbium coupled via a directional coupler 12 to a source of pump power 14. The doped optical fiber 10 supports an input port 16 adapted to receive an optical signal which requires amplification; and an output port 18 adapted to couple the signal which has been amplified to an optical fiber for transmission to a remote location. The source of pump power 14 comprises a first laser diode 20 and a second laser diode 22 selectively coupled to directional coupler 12 via optical switch 24 which can be activated either remotely or automatically. In operation, the first laser diode 20 can be coupled via optical switch 24 to directional coupler 12 to provide pump power to the optical fiber amplifier 10. Upon detection, via a telemetry system, that the output signal of the first laser diode 20 is diminished to a level which is below a predetermined value, a control signal which is generated remotely or automatically is applied to and operates the optical switch 24 and turns on the second laser. Optical switch 24, upon activation, disconnects the first laser diode 20 from the directional coupler 12, and connects the now turned on, second laser diode 22 to the directional coupler 12.

The prior art arrangement of two laser diode pumps selectively connected to an optical fiber doped with a rare earth element via an optical switch as illustrated in FIG. 1 is an arrangement of providing pump redundancy. Failure of the primary laser diode pump causes the optical switch 24 to be activated, either remotely or automatically, to connect the secondary laser diode pump 22 to the doped optical fiber to provide the pump power needed to keep the system operational.

Figure 2:
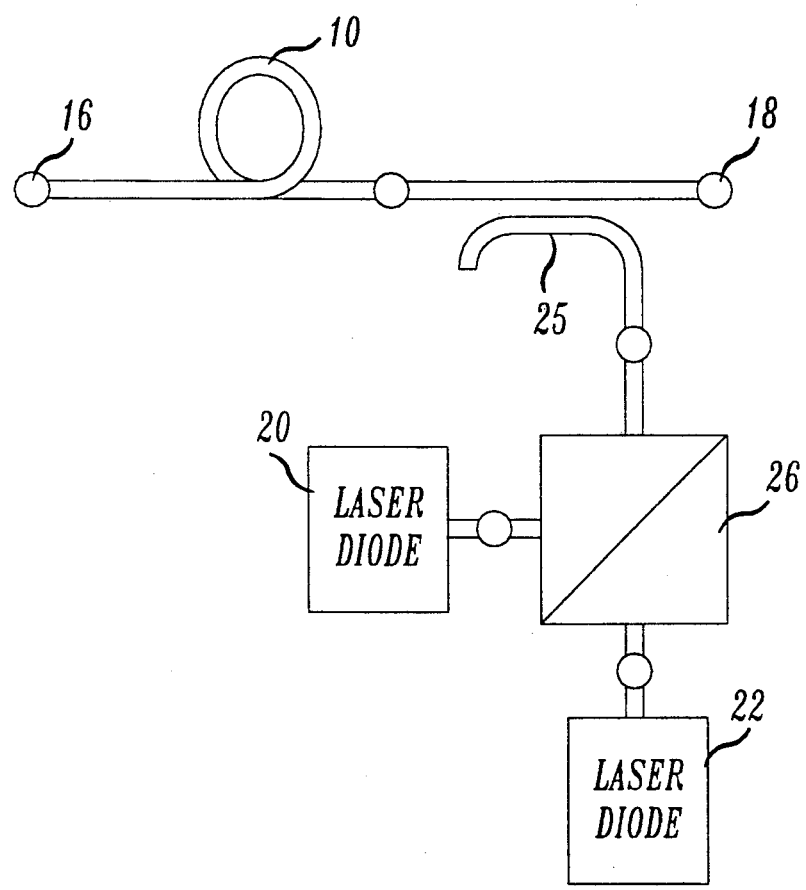
FIG. 2 illustrates another prior art arrangement for providing pump power redundancy to optical fiber amplifiers; and, FIG. 3 illustrates an arrangement for providing pump power redundancy to optical fiber amplifiers in accordance with the principles of the invention.

An alternative prior art embodiment of providing pump power redundancy is illustrated in FIG. 2. Specifically, a polarization-dependent optical coupler 26 is substituted for the optical switch. In this embodiment the first and second laser diodes 20, 22 are operated continuously, and each laser diode is coupled to continuously direct power to the doped amplifying fiber via the directional coupler 25. Thus, two laser diodes are connected to continuously direct pump power to the doped optical fiber. Obviously, the failure of one of the laser diodes will have negligible effect on the operation of the optical amplifier. This arrangement has the advantage of being completely passive and that both laser diode pumps can share the pumping. In another mode of operation, the pumps are operated sequentially. Only one pump is operated to any instant. Upon failure of the first pump, the second pump is activated and the first pump is deactivated.

In each of the prior art arrangement, both the optical switch and the polarization-dependent coupler do provide adequate laser pump redundancy. However, each optical amplifier requires two laser pumps for each doped optical fiber. Since laser diode pumps are the most expensive components of an optical amplifier, the cost of an optical amplifier having pump redundancy using an optical switch or a polarization-dependent coupler approaches a price which is almost double that of an optical amplifier which does not have pump redundancy.

Figure 3:
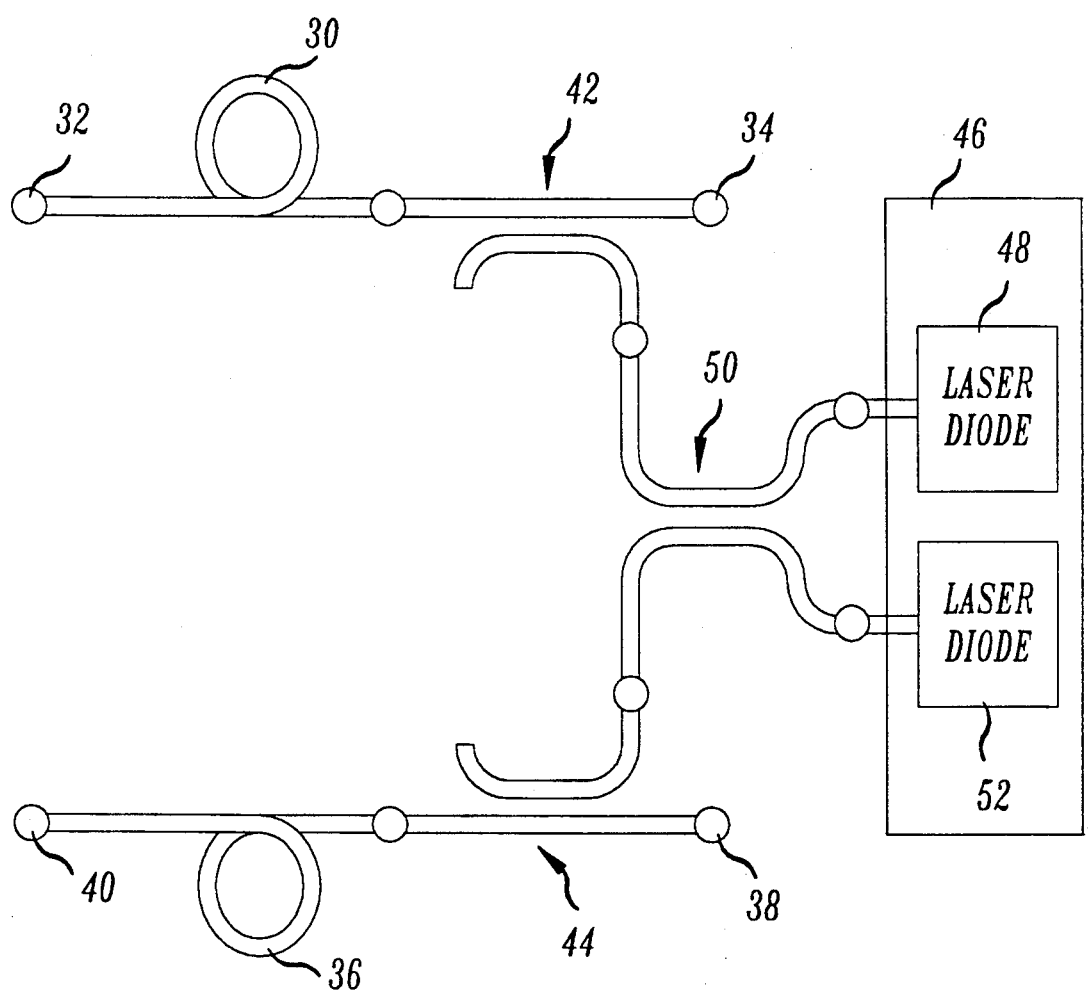

Referring to FIG. 3, there is illustrated a structure in accordance with the principles of the invention for providing optical amplifiers with pump redundancy at a substantially reduced cost. A first optical fiber 30 doped with a rare earth element supports an input port 32 adapted to be coupled to an optical fiber to receive an optical signal that is to be amplified; and, an output port 34 adapted to couple the signal amplified to an optical fiber for transmission to a remote location. A second optical fiber 36 doped with a rare earth element supports an input port 40 adapted to be coupled to an optical fiber to receive an optical signal that is to be amplified and an output port 38 adapted to be coupled to an optical fiber for transmission to a remote location. In an optical fiber telecommunication system, optical fiber amplifier 30 can be representative of an amplifier which amplifies optical signals which are transmitted in a first direction; and optical fiber amplifier 36 can be representative of an amplifier which amplifies optical signals which are transmitted in a second direction. Similarly, the optical fiber amplifier 30 can be coupled to a first optical transmission fiber and optical fiber amplifier 36 can be coupled to a second optical transmission fiber of a bundle of optical transmission fibers which carry optical signals in the same direction.

Power form a source of pump power 46 is coupled to the doped optical fiber of amplifier 30 by means of a directional coupler 42; and pump power is coupled to the doped optical fiber of amplifier 36 by means of a directional coupler 44. The source of pump power for the two doped optical fibers 30, 36 can comprise two laser diodes 48, 52 coupled through a directional coupler 50 to simultaneously provide pump power to the first doped optical fiber 30 and the second doped optical fiber 36. More specifically, the source of pump power 46 can comprise a first laser diode pump 48 coupled to each of the two directional couplers 42 and 44 via 3 dB coupler 50, and a second laser diode pump 52 also coupled to each of the two directional couplers 42 and 44 via 3 dB coupler 50. In operation, each laser diode pump can be operated either simultaneously or in sequence. When the laser diode pumps are operated simultaneously, each laser diode pump supplies one-half of its output power to each of the optical fiber amplifiers 30, 36 simultaneously. When the laser diode pumps are operated sequentially, one laser diode pump is operated initially and the second is a spare which is activated when the first becomes inoperative. In another embodiment, each laser diode pump can be operated at one-half power where one of the laser diode pumps goes to full power when the other fails.

By using a simple 3 dB optical coupler, i.e., coupler 50 to combine and split the pump power from two laser diode pumps to pump two optical fiber amplifiers simultaneously, pump redundancy is provided with only a single laser diode pump for each optical fiber amplifier. Thus, the cost of providing pump redundancy for optical amplifiers is reduced to the cost of a simple 3 dB coupler.

It is to be noted that the self-regulating nature of optical fiber amplifiers supports the optical fiber amplifier pump redundancy here disclosed when used in the mode where both pumps are active simultaneously. In the event that one of the laser diode pumps fails, the other laser diode pump will provide pump power simultaneously to each optical fiber amplifier, albeit at 3 dB less pump power to each optical fiber amplifier. But, because an optical fiber amplifier chain is self-regulating, the lower gain and output power of the optical fiber amplifier caused by a loss of 3 dB pump power at any one repeater of a telecommunications network having a plurality of repeaters will automatically be compensated for by an increase in gain at subsequently occurring repeaters.

The foregoing illustrates the principles of the invention and those skilled in the art will be able to devise numerous arrangements which, although not explicitly shown or described herein, embody the principles of the invention.

We claim:

1. Optical fiber amplifiers having pump redundancy comprising a first doped optical fiber, an input port adapted to couple optical signals to said first doped optical fiber, an output port coupled to receive the signal amplified by said first doped optical fiber,
a first directional coupler adapted to couple pump power to said first doped optical fiber,
a second doped optical fiber,
an input port adapted to couple optical signals to said second doped optical fiber,
an output port coupled to receive the signal amplified by said second doped optical fiber,
a second directional coupler adapted to couple pump power to said second doped optical fiber,
a laser diode pump source, and
coupler means interposed between said laser diode pump source and said first and second directional couplers to couple pump power from said laser diode pump source to said first and second doped optical fibers simultaneously.

2. The structure of claim 1 wherein said first and second optical fibers are doped with erbium.

3. The structure of claim 1 wherein said coupler means comprises a directional coupler.

4. The structure of claim 3 wherein said directional coupler is a 3 dB coupler.

5. The structure of claim 1 wherein said laser diode pump source comprises a first laser diode and a second laser diode.

6. The structure of claim 5 wherein said first and second laser diodes are coupled to operate sequentially.

7. The structure of claim 5 wherein said first and second laser diodes are coupled to operate simultaneously at reduced power until one of the laser diodes experiences a failure whereupon the other laser diode is operated at increased power.

* * * * *